(12) United States Patent
Chen et al.

(10) Patent No.: US 6,929,965 B2
(45) Date of Patent: Aug. 16, 2005

(54) EARLY RESPONSE TO PLASMA/CHARGING DAMAGE BY SPECIAL PATTERN DESIGN OF ACTIVE REGION

(75) Inventors: Bor-Cheng Chen, Taipei (TW); Yu-Feng Tai, Hsin-chu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 10/462,266

(22) Filed: Jun. 16, 2003

(65) Prior Publication Data

US 2003/0194822 A1 Oct. 16, 2003

Related U.S. Application Data

(62) Division of application No. 09/356,002, filed on Jul. 16, 1999, now Pat. No. 6,593,157.

(51) Int. Cl.⁷ .............................................. H01L 21/66
(52) U.S. Cl. .............................. 438/18; 438/14; 438/17; 257/48
(58) Field of Search .............................. 438/11, 14, 17, 438/18, 197; 257/48

(56) References Cited

U.S. PATENT DOCUMENTS

| | | | |
|---|---|---|---|
| 5,596,207 A | 1/1997 | Krishnan et al. | 257/48 |
| 5,638,006 A | 6/1997 | Nariani et al. | 324/765 |
| 5,650,651 A | 7/1997 | Bui | 257/355 |
| 5,781,445 A | 7/1998 | Shiue et al. | 364/481 |
| 5,886,363 A * | 3/1999 | Hamada et al. | 257/48 |
| 6,005,266 A * | 12/1999 | Forrest et al. | 257/258 |
| 6,150,669 A * | 11/2000 | Nandakumar et al. | 257/48 |
| 6,175,140 B1 * | 1/2001 | Kajiyama | 257/401 |

OTHER PUBLICATIONS

S. Wolf, "Silicon Processing for the VLSI Era", vol. 3: The Submicron MOSFET, Lattice Press, Sunset Beach, CA, (1995), pp. 507–509.

* cited by examiner

Primary Examiner—George Eckert
Assistant Examiner—N. Drew Richards

(57) ABSTRACT

A method of early and effective detection of plasma damage to a gate oxide layer by a special design of the active region is achieved. A plasma-damage testing structure is fabricated by providing a gate electrode overlying an active area of a semiconductor substrate wherein a gate oxide layer underlies the gate electrode. A portion of the active area underlying the gate electrode has sharp corners. The plasma-damage testing structure is exposed to a plasma environment. Electrical tests are performed to detect plasma damage to the plasma-damage testing structure. This model provides an accurate evaluation of plasma damage to actual MOSFET's.

8 Claims, 4 Drawing Sheets

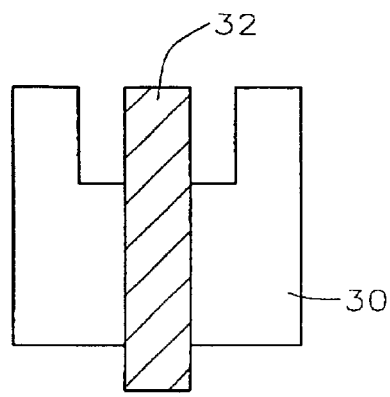
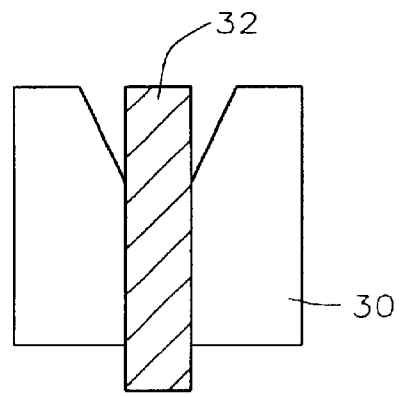
FIG. 4A   FIG. 4B
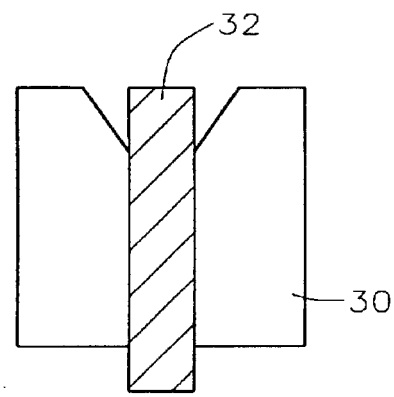
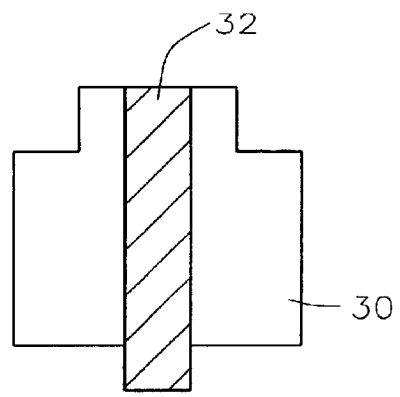
FIG. 4C   FIG. 4D
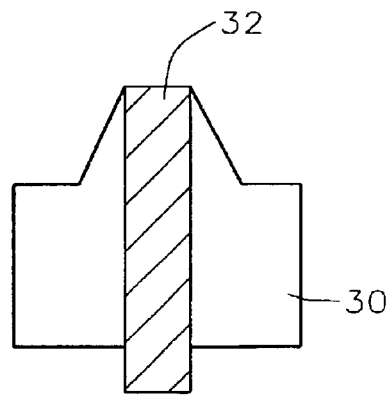
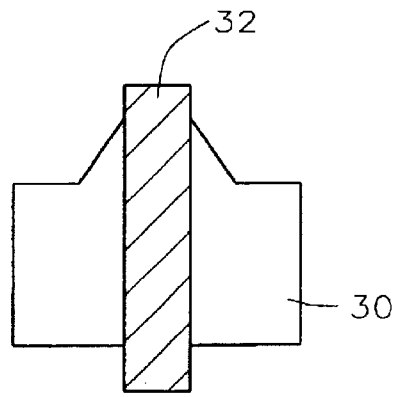
FIG. 4E   FIG. 4F

US 6,929,965 B2

EARLY RESPONSE TO PLASMA/CHARGING DAMAGE BY SPECIAL PATTERN DESIGN OF ACTIVE REGION

This is a division of patent application Ser. No. 09/356, 002, filing date Jul. 16, 1999 U.S. Pat. No. 6,593,157, Early Response To Plasma/Charging Damage by Special Pattern Design Of Active Region, assigned to the same assignee as the present invention.

BACKGROUND OF THE INVENTION (1) Field of the Invention

The present invention relates to the fabrication of integrated circuit devices, and more particularly, to a method of early detection of plasma/charging damage in the fabrication of integrated circuit devices.

(2) Description of the Prior Art

The manufacture of large scale integrated circuits involves hundreds of processing steps. Most of these processing steps involve depositing layers of material, patterning them by photolithographic techniques, and etching away the unwanted portions. Plasma etching processes are often used because they are dry processes and they provide the cleanliness and degree of control required in integrated circuit manufacture.

The most important semiconductor device in current technology is the metal-oxide-silicon field effect transistor (MOSFET). This device consists of two shallow regions of one type semiconductor—the source and drain—seperated by a region of another type—the channel region. A gate electrode overlies the channel region and is separated from it by a thin gate oxide layer. This thin gate oxide layer is one of the most critical components of the MOSFET. Typically, the gate oxide layer is thermally grown silicon oxide having a thickness on the order of 70–150 Angstroms in the current 0.25 micron design rule. An insulating film this thin is highly susceptible to damage such as from ion and electron bombardment from plasmas during backend processing. Plasma-induced degradation of gate oxide reliability is a key issue in achieving high performance MOSFET's.

The multiple exposures of gate oxides to steps involving plasmas has led to the emergence of several test structures designed to amplify the charging exposure and thereby allow proper and timely assessment of damage caused by the plasma processing steps. Plasma damage test structures are discussed in *Silicon Processing for the VLSI Era*, Vol. 3, by S. Wolf, Lattice Press, Sunset Beach, Calif. (1995) pp. 507–9. The conventional test structures fall into one of two categories: 1) antenna structures which have large areas of conductor exposed to plasma as compared to area of gate oxide, and 2) large area capacitors which are formed over the gate oxide. In addition, both types of structures may be either edge-intensive or area-intensive. However, it is difficult for these structures to catch plasma-induced damage in a timely manner if the damage is very slight.

A number of patents have addressed the plasma-induced damage issue. U.S. Pat. No. 5,650,651 to Bui discloses a plasma damage reduction device. U.S. Pat. No. 5,781,445 describes a plasma damage test structure consisting of a MOSFET surrounded by a conductive shield grounded to the substrate. U.S. Pat. No. 5,596,207 to Krishnan et al discloses a modified MOS structure having conductive sidewalls over a gate used to test for plasma damage. U.S. Pat. No. 5,638,006 to Nariani et al teaches the use of a testing structure that can differentiate weak oxide from charge-damaged oxide using an antenna structure.

SUMMARY OF THE INVENTION

Accordingly, it is a primary object of the invention to provide a reliable and very manufacturable method for detecting plasma damage to a gate oxide layer in the fabrication of integrated circuit devices.

A further object of the invention is to provide a process for early and effective detection of plasma damage to a gate oxide layer.

Another object is to provide a process for early and effective detection of plasma damage to a gate oxide layer by a special design of the active region.

Yet another object is to provide a testing structure for early and effective detection of plasma damage to a gate oxide layer having a special design of the active region.

In accordance with the objects of the invention, a method of early and effective detection of plasma damage to a gate oxide layer by a special design of the active region is achieved. A plasma-damage testing structure is fabricated by providing a gate electrode overlying an active area of a semiconductor substrate wherein a gate oxide layer underlies the gate electrode. A portion of the active area underlying the gate electrode has sharp corners. The plasma-damage testing structure is exposed to a plasma environment. Electrical tests are performed to detect plasma damage to the plasma-damage testing structure. This model provides an accurate evaluation of slight plasma damage to actual MOSFET's.

BRIEF DESCRIPTION OF THE DRAWINGS

In the accompanying drawings forming a material part of this description, there is shown:

FIGS. 4A through 4F are top-view representations of preferred embodiments of the plasma damage testing structure of the present invention.

DESCRIPTION OF THE PREFERRED EMBODIMENTS

Figure 1:
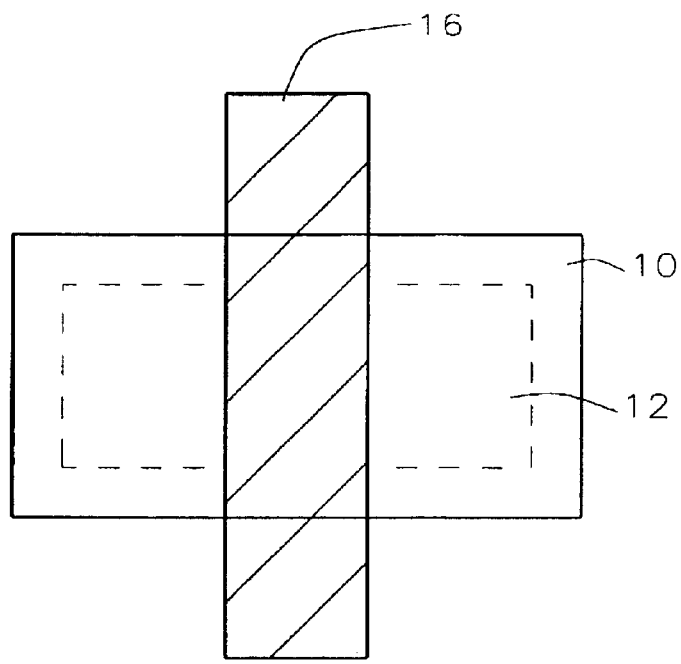
FIG. 1 is a top-view representation of a testing structure of the prior art.

Referring now to FIG. 1, there is illustrated a conventional plasma-damage testing structure of the prior art. Active area 10 is shown. Field oxide area 12 has been formed over the semiconductor substrate in the active area. Polysilicon gate 16 is shown within the active area. The gate oxide layer, not shown, underlies and is covered by the polysilicon gate 16.

Figure 2:
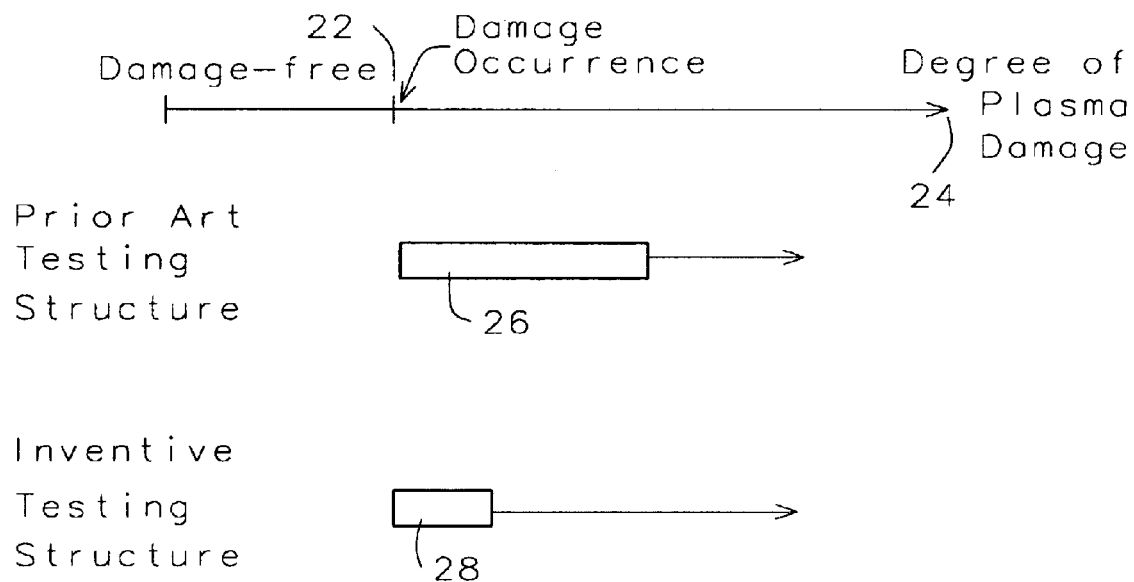
FIG. 2 is a representation of the difference in sensitivity of a prior art testing structure and the testing structure of the present invention.

FIG. 2 illustrates the degree of plasma-induced damage to the gate oxide shown across the top of the figure where no damage occurs to the left of line 22. Increasing damage is shown to the right of line 22 in the direction of the arrow 24. Slight damage occurs immediately to the right of line 22. With a testing structure of the prior art, such as that shown in FIG. 1, there is a large "blind spot" 26 where damage occurs, but is not revealed by the testing structure. Greater damage to the right of the blind spot 26 can be caught by the testing structure.

In contrast, with the testing structure of the present invention, there is only a small blind spot 28. Damage to the right of the blind spot 28 is revealed by the testing structure of the invention. Thus, the invention provides a more sensitive testing structure. Slight plasma damage that cannot be detected by the old method can be detected with the new method. This model allows an accurate evaluation of plasma/charging damage of actual MOSFET's for the future VLSI era.

The process of the present invention for forming plasma-induced damage testing structures will now be described. FIGS. 3A through 3F illustrate top views of various possible configurations of the special active region patterns of the invention. The active area is defined, for example, by a silicon nitride hard mask. The area outside and surrounding the active area comprises field oxide.

The special pattern is applied to the active region 30. The special pattern consists of an indentation in or a protuberance from the rectangular part of the active area, as shown in FIGS. 3A–3F. Thus, the active area has. sharp corners or edges. This pattern enhances the degree of plasma damage to the active region caused by the residual stress from the edges or corners of the active area.

Figure 3A:
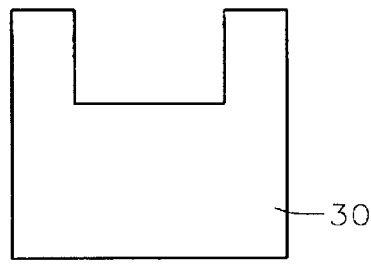
FIGS. 3A through 3F are top-view representations of preferred embodiments of the special active regions of the present invention.
Figure 3B:
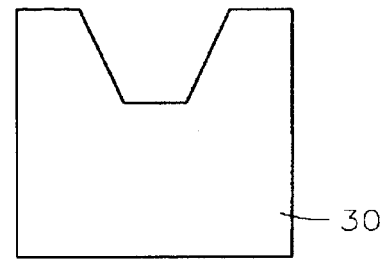
Figure 3C:
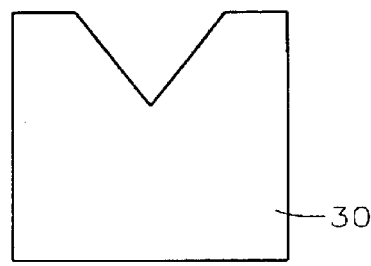
Figure 3D:
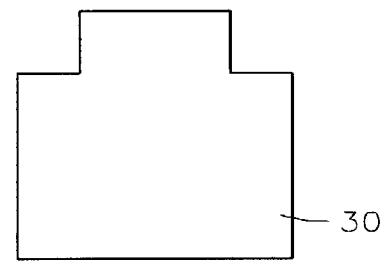
Figure 3E:
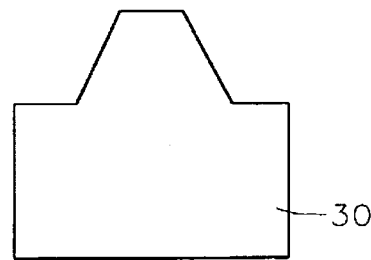
Figure 3F:
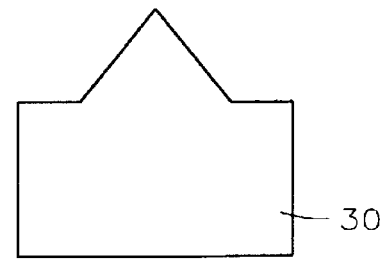

For example, the active area patterns shown in FIGS. 3A–3F have a rectangular shape in top view. An indentation is cut into or a protuberance is formed out of the rectangular part of the active area. The indentation may have a rectangular shape as shown in FIG. 3A, inwardly sloping sidewalls with a flat bottom as shown in FIG. 3B, or a V-shape as shown in FIG. 3C. The protuberance may have a rectangular shape as shown in FIG. 3D, outwardly sloping sidewalls with a flat top as shown in FIG. 3E, or an inverted V-shape as shown in FIG. 3F. Other shapes having sharp corners are possible.

A gate oxide layer is formed over the active area. A conduction layer is deposited over the gate oxide layer. The conduction layer and gate oxide layer are patterned to form the gate pattern 32 on the active region, as shown in FIGS. 4A–4F. The conduction layer may be polysilicon or a metal, for example.

These testing structures can now be used for both edge-intensive and area-intensive plasma-damage monitoring. Wafers having these testing structures are exposed to a plasma environment. During exposure to a plasma environment, electron charge punches through the gate oxide (underlying the gate 32) to the substrate. Thus, pinholes will be formed in the gate oxide due to the plasma charge. Next, electrical tests are performed to calculate the degree of plasma damage.

Figure 5:
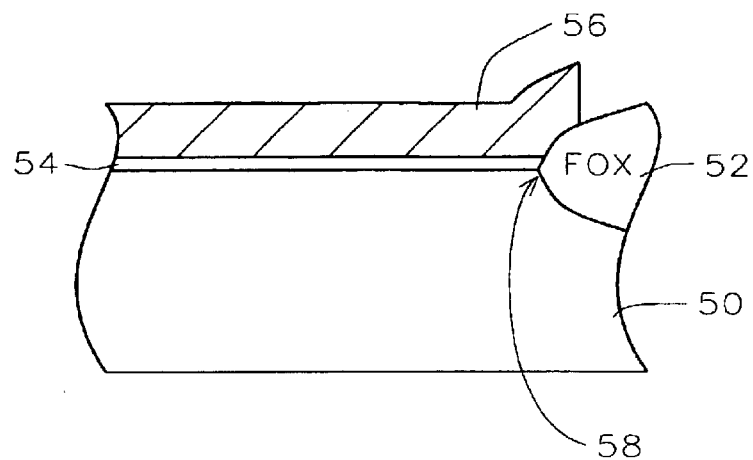
FIG. 5 is a cross-sectional representation of a gate structure to be simulated by the testing structure of the invention.
Figure 6:
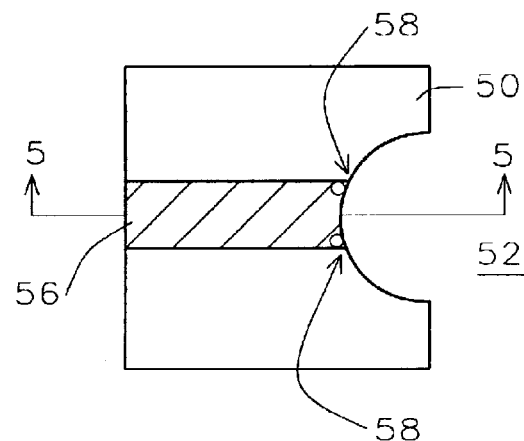
FIG. 6 is a top-view of the gate structure to be simulated by the testing structure of the invention shown in cross-section in FIG. 5.

For example, FIGS. 5 and 6 illustrate a MOSFET to be modeled by the test structure of the invention. In the figures, polysilicon gate 56 overlies a gate oxide layer 54 and a field oxide region 52 in and on a semiconductor substrate 50. FIG. 5 shows the cross-section 5—5 of the top view shown in FIG. 6. Damage to the gate oxide layer 54 is often seen near the edge of the FOX region 52 as indicated by 58 in the two figures.

Figure 7:
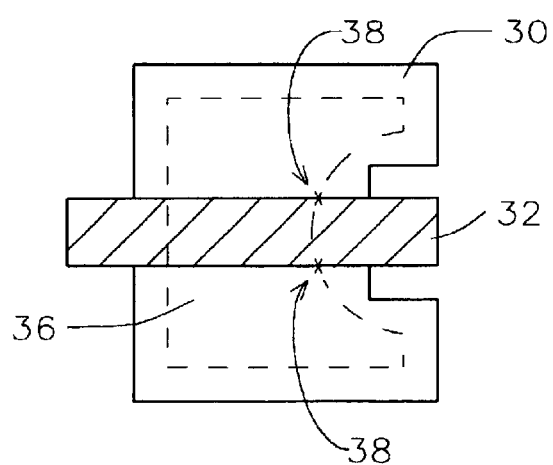
FIG. 7 is a top view of a preferred embodiment of the testing structure of the present invention showing plasma damage.

FIG. 7 illustrates in top view the testing structure of the present invention to be used to monitor plasma damage for the structure of the MOSFET example shown in FIGS. 5 and 6. 30 is the active area pattern used in the testing structure. The active area pattern has sharp corners which will enhance the degree of plasma damage to the test structure. The dashed line 36 indicates the real active area shape of the MOSFET. 32 is the gate pattern comprising a conductive layer overlying a gate oxide layer. The x's 38 shown in FIG. 7 indicate weak points due to stress during field oxide formation. Even very slight damage to the gate oxide layer can be detected by the test structures of the invention.

The process of the present invention applies a special active region pattern as a plasma damage sensor. This sensor will monitor plasma/charging damage earlier and more effectively than the prior art testing structures. The testing structures of the invention use an active region pattern having sharp corners that enhances the degree of plasma damage by the residual stress from the edges or corners of the active region. This allows slight damage that cannot be caught by the previous methods to be detected, allowing for an early response to plasma damage.

While the invention has been particularly shown and described with reference to the preferred embodiments thereof, it will be understood by those skilled in the art that various changes in form and details may be made without departing from the spirit and scope of the invention.

What is claimed is:

1. A method of detecting plasma damage comprising:
   fabricating a plasma-damage testing structure comprising
      providing a gate electrode overlying an active area of a semiconductor substrate wherein a portion of said active area directly underneath said gate electrode has sharp corners;
   exposing said plasma-damage testing structure to a plasma environment; and
   performing electrical tests to detect plasma damage to said plasma-damage testing structure.

2. The method according to claim 1 wherein said sharp corners cause residual stress in said active area which enhances the degree of plasma damage to said active area.

3. The method according to claim 1 wherein said active area has a rectangular shape in top view having an indentation cut into said rectangular shape wherein said indentation has sharp corners.

4. The method according to claim 1 wherein said active area has a rectangular shape in top view having a protuberance protruding out of said rectangular shape wherein said protuberance has sharp corners.

5. A method of detecting plasma damage comprising:
   fabricating a plasma-damage testing structure comprising
      providing a gate electrode overlying an active area of a semiconductor substrate wherein a gate oxide layer underlies said gate electrode and wherein a portion of said active area directly underneath said gate electrode has sharp corners;
   exposing said plasma-damage testing structure to a plasma environment; and
   performing electrical tests to detect plasma damage to said plasma-damage testing structure.

6. The method according to claim 5 wherein said sharp corners cause residual stress in said active area which enhances the degree of plasma damage to said gate oxide layer.

7. The method according to claim 5 wherein said active area has a rectangular shape in top view having an indentation cut into said rectangular shape wherein said indentation has sharp corners.

8. The method according to claim 5 wherein said active area has a rectangular shape in top view having a protuberance protruding out of said rectangular shape wherein said protuberance has sharp corners.

* * * * *